(12) United States Patent
Tsau et al.

(10) Patent No.: US 11,855,181 B2
(45) Date of Patent: Dec. 26, 2023

(54) TUNING THRESHOLD VOLTAGE IN FIELD-EFFECT TRANSISTORS

(71) Applicant: Taiwan Semiconductor Manufacturing Co., Ltd., Hsin-Chu (TW)

(72) Inventors: Hsueh Wen Tsau, Miaoli County (TW); Ziwei Fang, Hsinchu (TW); Huang-Lin Chao, Hillsboro, OR (US); Kuo-Liang Sung, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/676,691

(22) Filed: Feb. 21, 2022

(65) Prior Publication Data

US 2022/0181467 A1 Jun. 9, 2022

Related U.S. Application Data

(62) Division of application No. 16/573,733, filed on Sep. 17, 2019, now Pat. No. 11,257,923.

(Continued)

(51) Int. Cl.
*H01L 29/66* (2006.01)
*H01L 29/78* (2006.01)
(Continued)

(52) U.S. Cl.
CPC .. *H01L 29/66545* (2013.01); *H01L 21/02178* (2013.01); *H01L 21/02181* (2013.01);
(Continued)

(58) Field of Classification Search
CPC ............. H01L 29/0653; H01L 29/0673; H01L 29/165; H01L 29/42392; H01L 29/4966; H01L 29/513; H01L 29/517; H01L 29/66439; H01L 29/66545; H01L 29/66795; H01L 29/775; H01L 29/7848; H01L 29/785; H01L 29/78696; H01L 23/82
See application file for complete search history.

(56) References Cited

U.S. PATENT DOCUMENTS

2007/0249163 A1 10/2007 Oikawa
2014/0167187 A1* 6/2014 Kuo ...................... H01L 29/785
257/411

(Continued)

*Primary Examiner* — Omar F Mojaddedi
(74) *Attorney, Agent, or Firm* — HAYNES AND BOONE, LLP

(57) ABSTRACT

A semiconductor structure includes an interfacial layer disposed over a semiconductor layer, a high-k gate dielectric layer disposed over the interfacial layer, where the high-k gate dielectric layer includes a first metal, a metal oxide layer disposed between the high-k gate dielectric layer and the interfacial layer, where the metal oxide layer is configured to form a dipole moment with the interfacial layer, and a metal gate stack disposed over the high-k gate dielectric layer. The metal oxide layer includes a second metal different from the first metal, and a concentration of the second metal decreases from a top surface of the high-k gate dielectric layer to the interface between the high-k gate dielectric layer and the interfacial layer.

20 Claims, 17 Drawing Sheets

Related U.S. Application Data

(60) Provisional application No. 62/745,004, filed on Oct. 12, 2018.

(51) Int. Cl.
*H01L 29/06* (2006.01)
*H01L 29/423* (2006.01)
*H01L 23/38* (2006.01)
*H01L 29/49* (2006.01)
*H01L 21/02* (2006.01)
*H01L 23/28* (2006.01)
*H01L 21/82* (2006.01)
*H01L 21/56* (2006.01)

(52) U.S. Cl.
CPC .............. *H01L 21/56* (2013.01); *H01L 21/82* (2013.01); *H01L 23/28* (2013.01); *H01L 29/66795* (2013.01); *H01L 29/785* (2013.01)

(56) References Cited

U.S. PATENT DOCUMENTS

| | | | |
|---|---|---|---|
| 2015/0054029 A1* | 2/2015 | Jangjian | H01L 29/4958 257/190 |
| 2016/0020104 A1* | 1/2016 | Lin | H01L 29/66545 438/585 |
| 2016/0093535 A1* | 3/2016 | Xu | H01L 29/517 438/275 |
| 2016/0181163 A1* | 6/2016 | Huang | H01L 29/4966 257/369 |
| 2017/0025514 A1* | 1/2017 | Wu | H01L 29/4966 |
| 2017/0309723 A1* | 10/2017 | Ando | H01L 29/66545 |
| 2018/0331219 A1* | 11/2018 | Liou | H01L 29/6653 |

\* cited by examiner

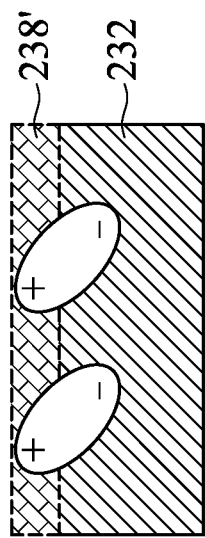
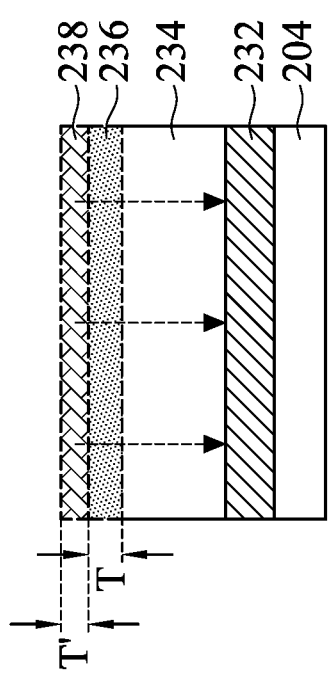
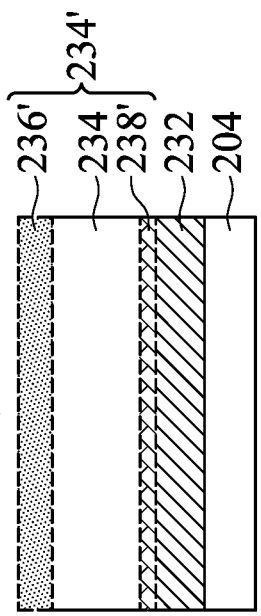
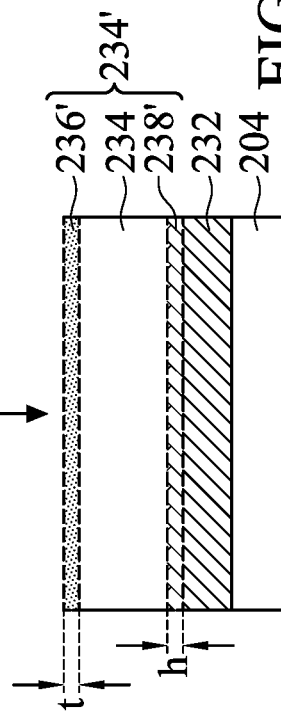

TUNING THRESHOLD VOLTAGE IN FIELD-EFFECT TRANSISTORS

CROSS-REFERENCE TO RELATED APPLICATIONS

This is a divisional of a U.S. Non-Provisional patent application Ser. No. 16/573,733, file on Sep. 17, 2019, and titled "Tuning Threshold Voltage in Field-Effect Transistors," which claims priority to U.S. Provisional Patent Application Ser. No. 62/745,004, filed on Oct. 12, 2018, and titled "Tuning Threshold Voltage in Field-Effect Transistors," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when fabricating field effect transistors (FETs), such as fin-like FETs (FinFETs), device performance can be improved by using a metal gate electrode instead of a polysilicon gate electrode. One process of forming a metal gate structure replaces a dummy polysilicon gate structure with the metal gate structure after other components of the device are fabricated. While this method of forming a metal gate structure has generally been adequate, challenges remain in implementing such fabrication process, especially with respect to improving device performance when feature sizes continue to decrease in FinFETs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A, 7B, 7C, and 7D are schematic representations of an embodiment of the semiconductor device of FIG. 2 during intermediate steps of an embodiment of the method of FIG. 1 according to various aspects of the present disclosure.

DETAILED DESCRIPTION

Figure 1:
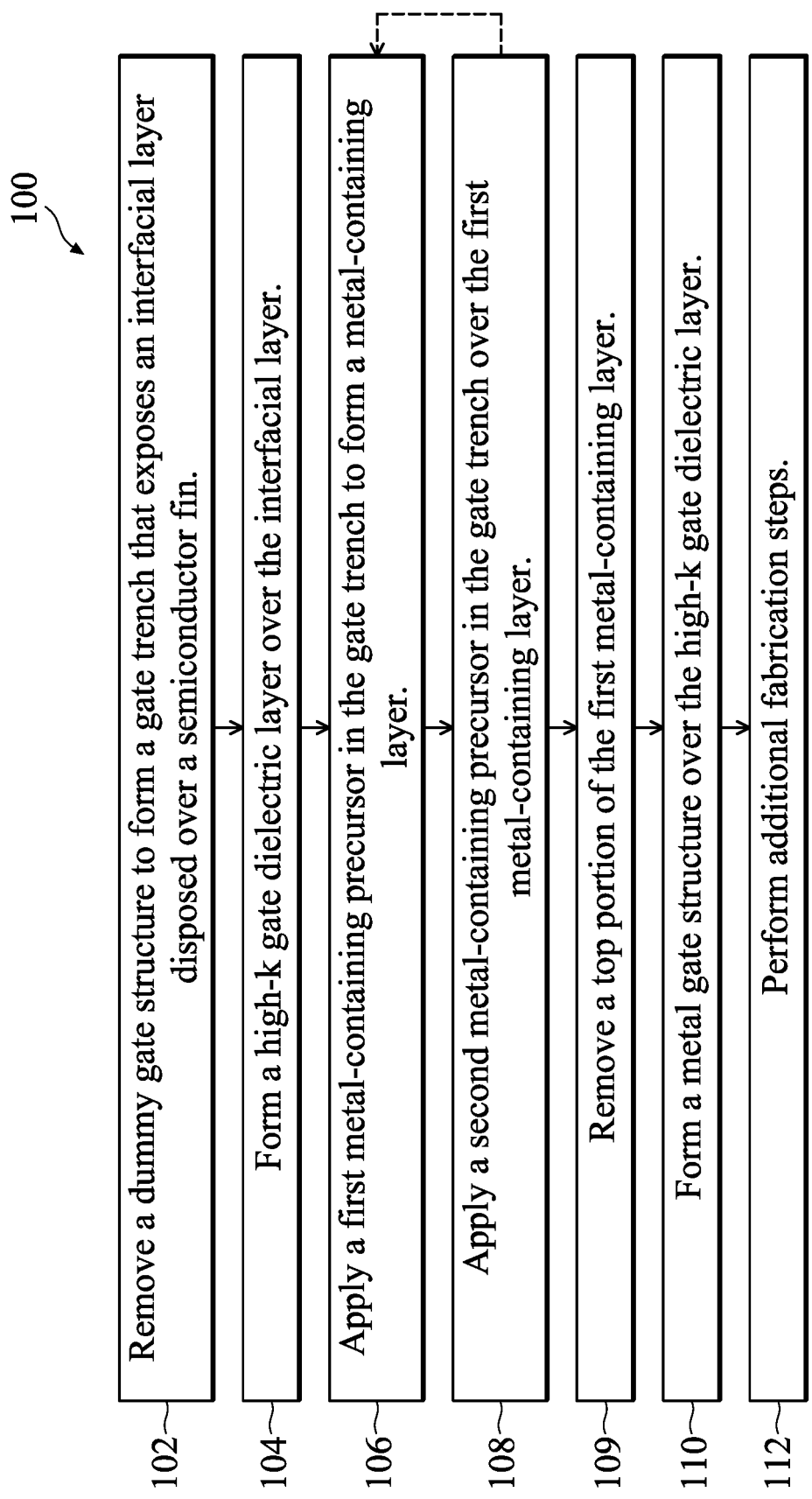
FIG. 1 shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to FinFETs and gate-all-around (GAA) devices. It is an objective of the present disclosure to provide high-k metal gates and methods of making the same during FinFET and GAA processes. In the present disclosure, "high-k" dielectric refers to one or more material used in a gate dielectric layer having a dielectric constant greater than that of silicon oxide ($SiO_2$).

During fabrication of a FinFET (or a GAA) device, a gate replacement process may be implemented to reduce thermal budget associated with the fabrication steps. The gate replacement process termed "gate-last" may be performed in a series of steps. For example, during a gate-last process, a dummy gate structure is first formed over a substrate as a placeholder before forming other components, e.g., source/drain features, of the device. Once subsequent fabrication steps are completed, the dummy gate structure is removed to allow a metal gate structure to be formed in its place. Multiple patterning processes may be implemented to form various material layers within the metal gate structure to improve the overall performance of the device. In one example, modulating threshold voltage ($V_t$) of the device has been accomplished by incorporating various material layers (e.g., gate dielectric layers and/or work function metal layers) and adjusting their respective thickness in the metal gate structure. However, as channel lengths decrease, many challenges arise when patterning the various material layers of the metal gate structure. On one hand, directly patterning work function metal layers is limited due to merged metal films as a result of decreased channel lengths. On the other hand, directly patterning gate dielectric layers is limited due to Vt instability introduced when forming the gate dielectric layer in a thermal driven-in process. Consequently, the present disclosure contemplates methods of forming metal gate structures that allow modulation of threshold voltage in devices with reduced features sizes.

Referring now to FIG. 1, a flow chart of a method 100 of forming a semiconductor device 200 is illustrated according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2 and 3A-9B, which illustrate a portion of the semiconductor device 200 during the intermediate steps of the method 100. FIGS. 3A, 4A, 5A, 6A, 7A, 7B, 7C, 7D and 9A are fragmentary cross-sectional views of the device 200 taken along line AA' at intermediate steps of the method 100. FIGS. 3B, 4B, 5B, 6B, and 9B are fragmentary cross-sectional views of the device 200 taken along line BB' at intermediate steps of the method 100. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 2:
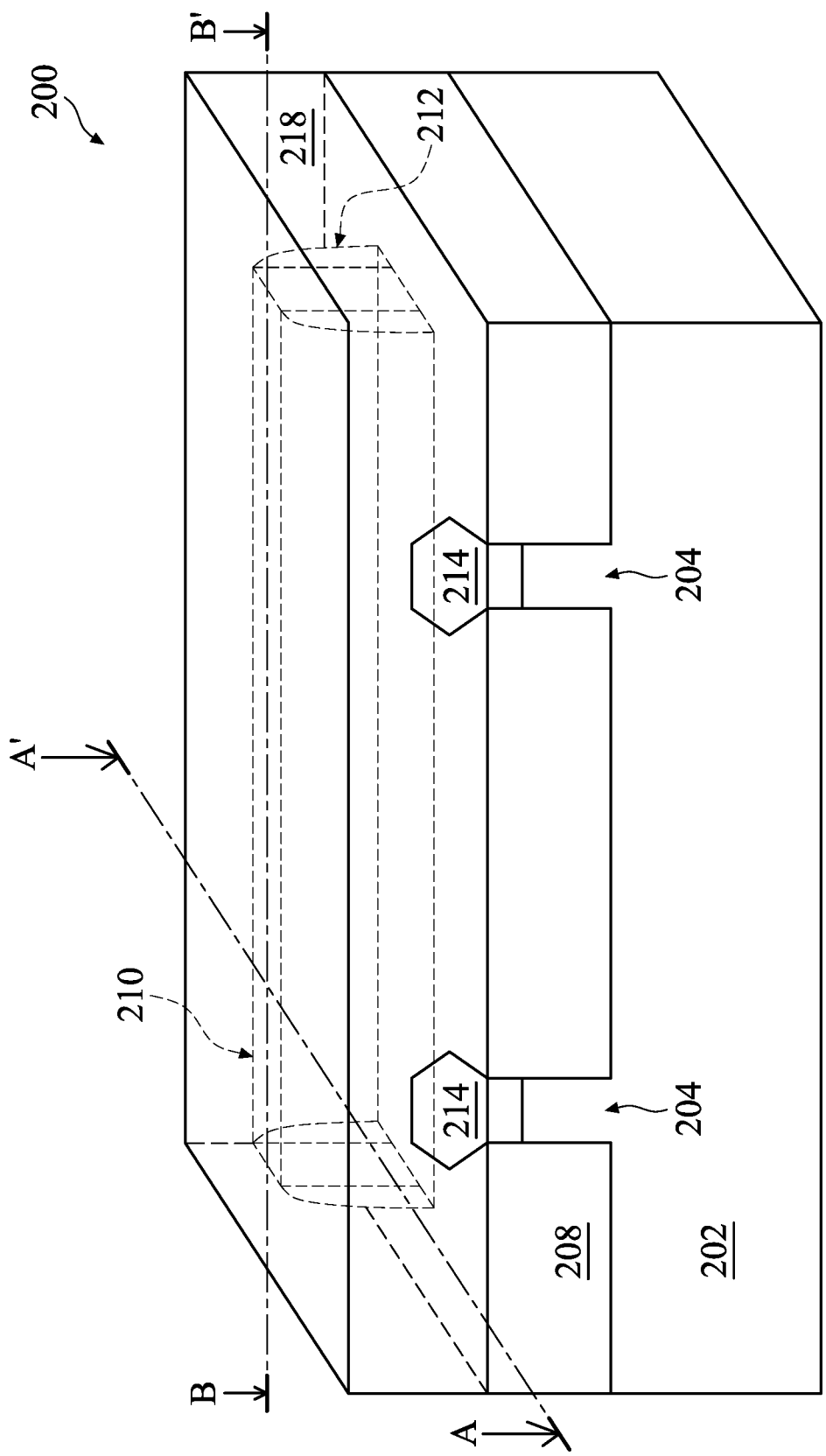
FIG. 2 is a perspective view of an embodiment of a semiconductor device according to various aspects of the present disclosure.

At operation 102, referring to FIGS. 1 and FIG. 2, the method 100 removes a dummy gate structure 210 from the device 200. In the present disclosure, the device 200 includes a substrate 202 having device regions (hereafter referred to fins) 204 disposed thereon, the dummy gate structure 210 disposed over the fins 204, and isolation structures 208 disposed over the substrate 202 separating various components of the device 200. For purpose of simplicity, intermediate steps of the method 100 are hereafter described with reference to cross-sectional views of the device 200 taken along a fin length direction of the fins 204 (i.e., the line AA'), as well as across a channel region of the fins 204 (i.e., the line BB').

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide or, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIG. 2, the fins 204 may be suitable for forming n-type and/or p-type FinFET. This configuration is for illustrative purposes only and does not limit the present disclosure. The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers.

Thereafter, referring to FIG. 2, the dummy gate structure 210 engages the fins 204 on three sides to form a channel region in each of the fins 204. In at least one embodiment, portions of the dummy gate structure 210 will be replaced with a high-k metal gate structure (HKMG) after other components of the device 200 are fabricated. The dummy gate structure 210 may include one or more material layers, such as an interfacial layer over the fins 204, a poly-silicon layer over the interfacial layer, a hard mask layer, a capping layer, and/or other suitable layers. Each of the material layers in the dummy gate structure 210 may be formed by any suitable deposition techniques, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), atomic layer CVD (AL-CVD), atmospheric pressure CVD (AP-CVD), and/or other suitable methods. In one embodiment, the dummy gate structure 210 is first deposited as a blanket layer. The blanket layer is then patterned through a series of lithography and etching processes, thereby removing portions of the blanket layer and keeping the remaining portions over the isolation structures 208 and the fins 204 as the dummy gate structure 210.

The device 200 may further includes gate spacers 212 disposed on sidewalls of the dummy gate structure 210. In at least one embodiment, the gate spacers 212 include a dielectric material, such as silicon oxide, silicon nitride, silicon carbide, silicon oxynitride, and/or other suitable dielectric materials. The gate spacers 212 may be a single layered structure or a multi-layered structure. The method 100 may form the gate spacers 212 by first depositing a blanket of spacer material over the device 200, and then performing an anisotropic etching process to remove portions of the spacer material to form the gate spacers 212 on sidewalls of the dummy gate structure 210.

Still referring to FIG. 2, the device 200 further includes source/drain features 214 disposed over the fins 204 and adjacent to the dummy gate structure 210. The source/drain features 214 may be formed by any suitable techniques, such as etching processes followed by one or more epitaxy processes. In one example, one or more etching processes are performed to remove portions of the fins 204 to form source/drain recesses (not shown) therein, respectively. A cleaning process may be performed to clean the source/drain recesses with a hydrofluoric acid (HF) solution or other suitable solution. Subsequently, one or more epitaxial growth processes are performed to grow epitaxial features in the source/drain recesses. Each of the source/drain features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

Though not depicted, the device 200 may further include a contact etch-stop layer (CESL; not shown) and an interlayer dielectric (ILD) layer 218 (FIG. 2). The CESL may comprise silicon nitride, silicon oxynitride, silicon nitride with oxygen or carbon elements, and/or other materials, and may be formed by CVD, PVD, ALD, and/or other suitable methods. In some embodiment, the ILD layer 218 includes a dielectric material, such as tetraethylorthosilicate (TEOS), a low-k dielectric material, doped silicon oxide (e.g., borophosphosilicate glass (BPSG), fused silica glass (FSG), phosphosilicate glass (PSG), boron doped silicon glass (BSG), etc.), and/or other suitable dielectric materials. The ILD layer 218 may include a multi-layer structure having multiple dielectric materials. The ILD layer 218 may be formed by a deposition process such as, for example, CVD, flowable CVD (FCVD), spin-on-glass (SOG) and/or other suitable methods. Subsequent to forming the ILD layer 218, a planarization process such as CMP may be performed such that a top portion of the dummy gate structure 210 is exposed.

Figure 3A:
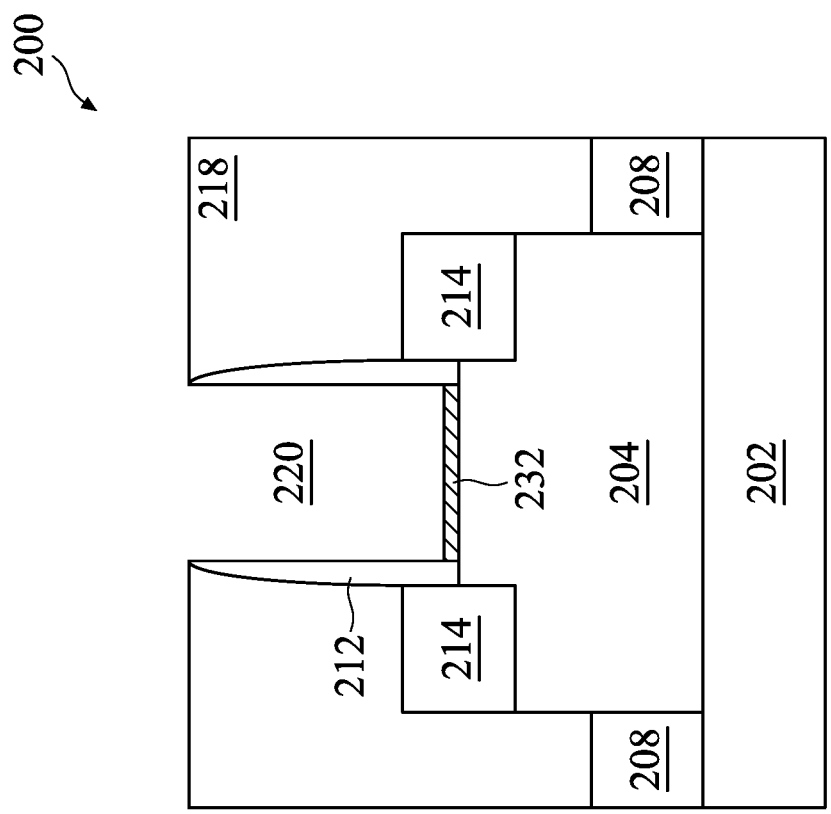
FIGS. 3A, 4A, 5A, 6A, and 9A are cross-sectional views of an embodiment of the semiconductor device of FIG. 2 along line AA' during intermediate steps of an embodiment of the method of FIG. 1 according to various aspects of the present disclosure.
Figure 3B:
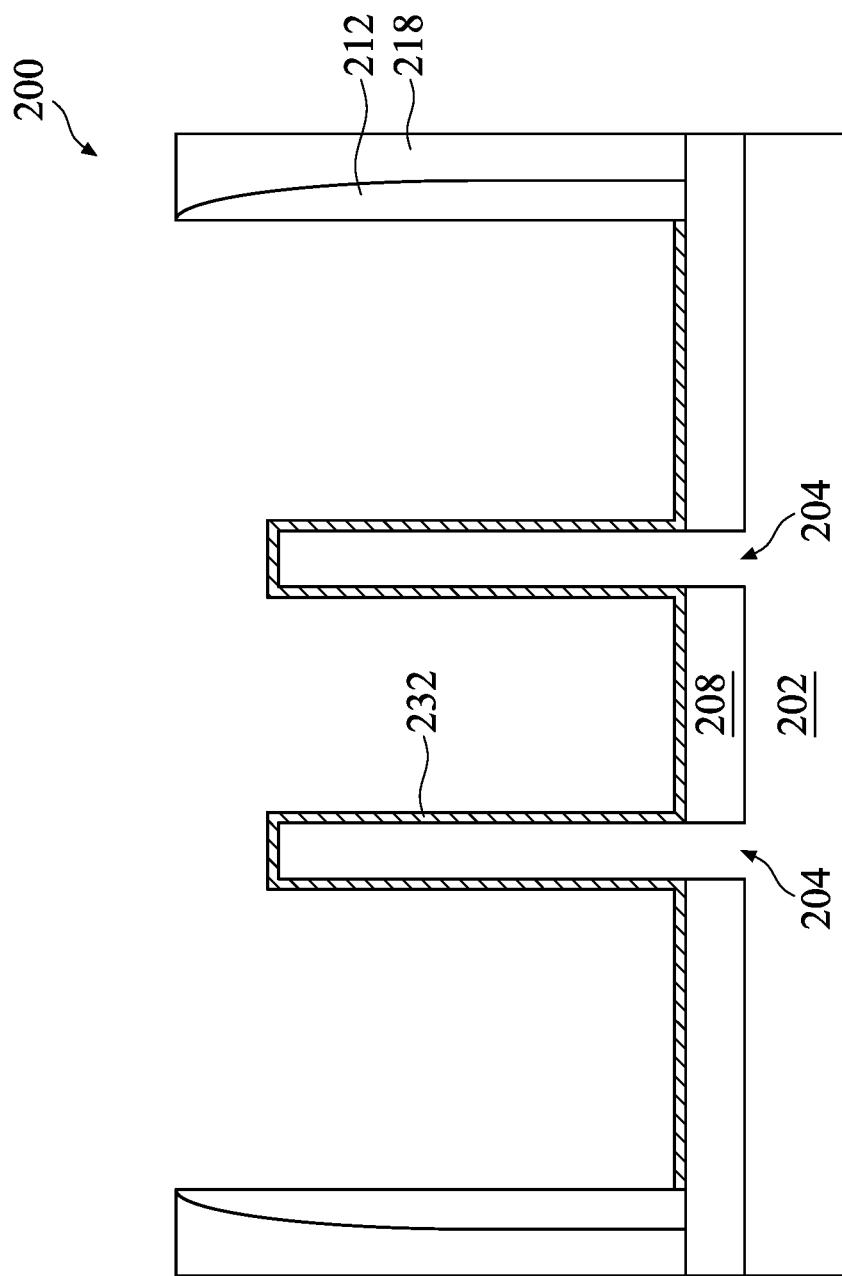
FIGS. 3B, 4B, 5B, 6B, and 9B are cross-sectional views of an embodiment of the semiconductor device of FIG. 2 along line BB' during intermediate steps of an embodiment of the method of FIG. 1 according to various aspects of the present disclosure.

Referring to FIGS. 1 and 3A-3B, the method 100 at operation 102 removes the dummy gate structure 210 to form a trench 220, thereby exposing the interfacial layer 232 disposed over portions of the fins 204. In some embodiments, forming the trench 220 includes performing an etching process that selectively removes the dummy gate structure 210. The etching process may be a dry etching process, a wet etching process, an RIE, other suitable methods, or combinations thereof. For example, a dry etching process may use chlorine-containing gases, fluorine-containing gases, and/or other etching gases. The wet etching solutions may include ammonium hydroxide (NH$_4$OH), hydrofluoric acid (HF) or diluted HF, deionized water, tetramethylammonium hydroxide (TMAH), and/or other suitable wet etching solutions. The etching process may be tuned such that the etching of the dummy gate structure 210 is subjected to a higher etch rate relative to the CESL and the ILD layer 218. In some embodiments, as depicted in FIGS. 3A-6B, 9A, and 9D, the interfacial layer formed between the poly-silicon layer and the fins 204 remains in the device 200 after removing the dummy gate structure 210 and becomes interfacial layer 232 (discussed in detail below). Alternatively, the interfacial layer is removed with the dummy gate structure 210 and formed subsequently before forming the HKMG. For embodiments in which the device 200 is a GAA device, the interfacial layer may be removed with the dummy gate structure 210 and deposited in a subsequent step before forming a high-k dielectric layer (e.g., high-k dielectric layer 234 discussed below).

Figure 4A:
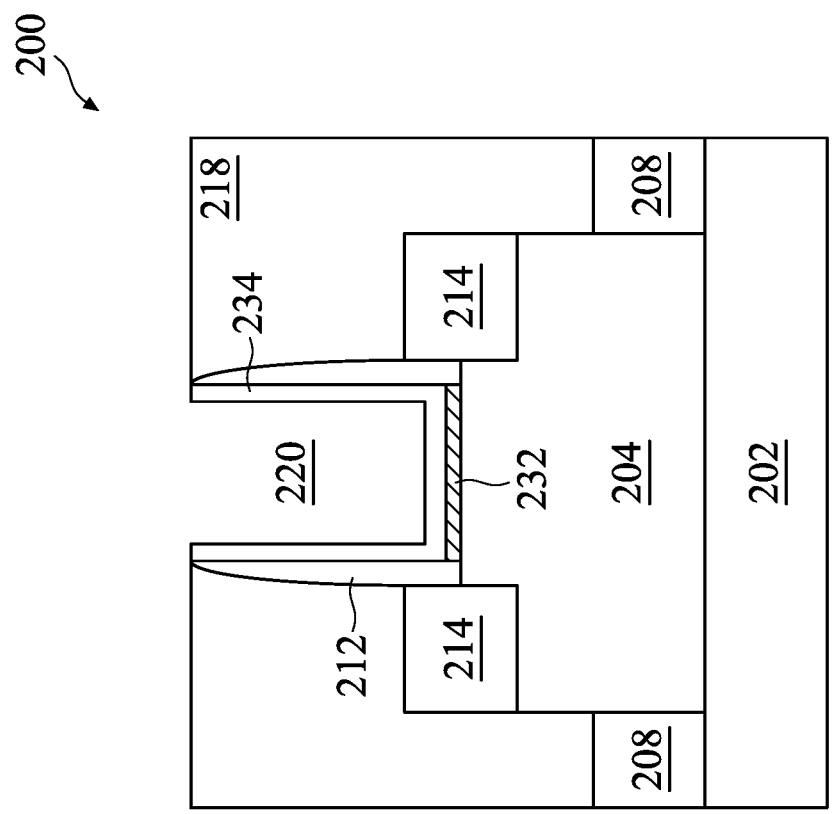
Figure 4B:
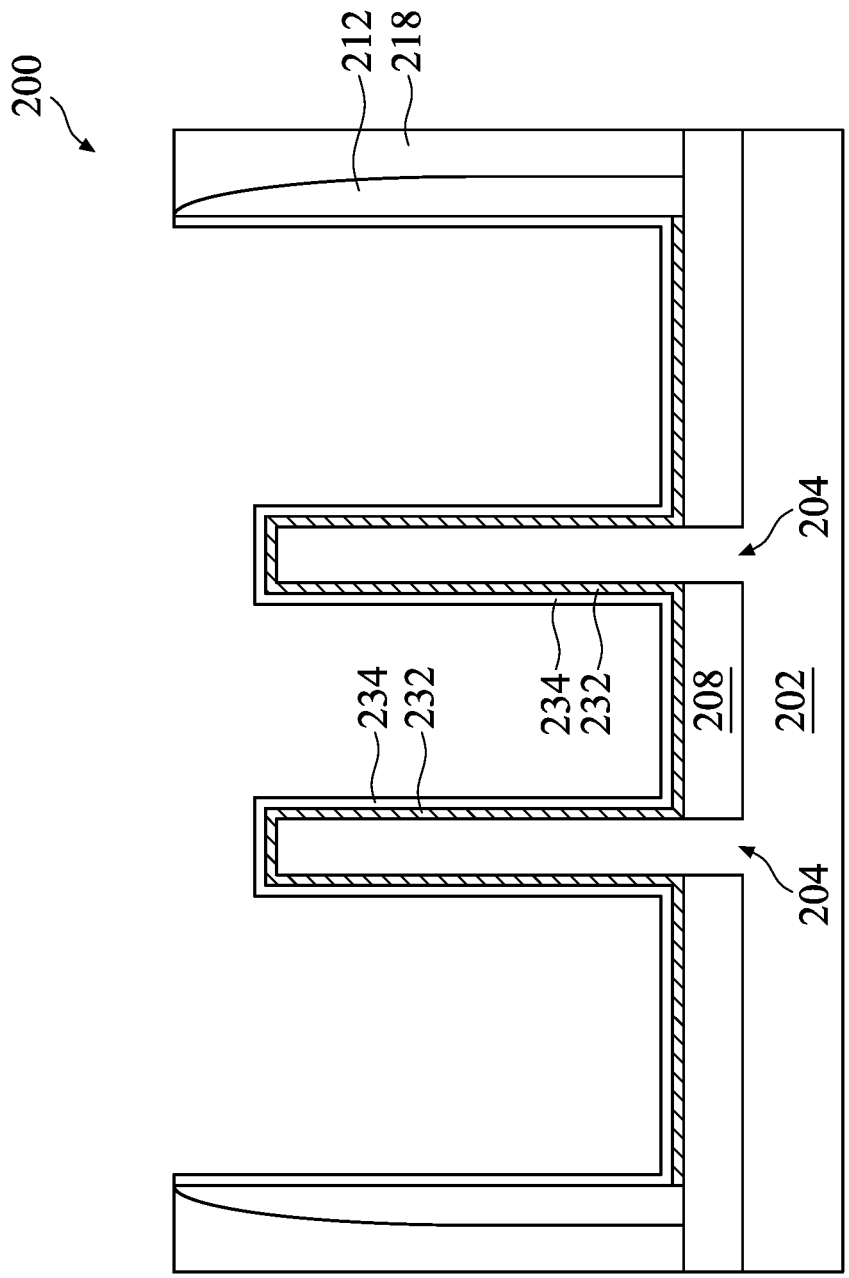

The method 100 proceeds to forming a HKMG in the trench 220, such that the HKMG structure is formed over channel regions of the fins 204. Referring to FIGS. 1 and 4A-4B, the method 100 at operation 104 forms a high-k dielectric layer 234 over the interfacial layer 232 in the trench 220. In many embodiments, the high-k dielectric layer 234 includes hafnium, oxygen, lanthanum, aluminum, titanium, zirconium, tantalum, silicon, other suitable materials, or combinations thereof and may be formed by any suitable method such as, for example, CVD, ALD, PVD, HDP-CVD, MO-CVD, RP-CVD, PE-CVD, LP-CVD, AL-CVD, AP-CVD, and/or other suitable methods. In some embodiments, the high-k dielectric layer 234 includes materials such as hafnium oxide, lanthanum oxide, aluminum oxide, zirconium oxide, tantalum oxide, other suitable materials, or combinations thereof. In an example embodiment, the high-k dielectric layer 234 includes hafnium oxide. For embodiments in which the device 200 is a GAA device, the interfacial layer 232 is deposited in the trench 220 before forming the high-k dielectric layer 234 any suitable method such as ALD. As such, portions of the interfacial layer 232 may be formed on sidewalls of the gate spacers 212 (see FIG. 11D).

Figure 5A:
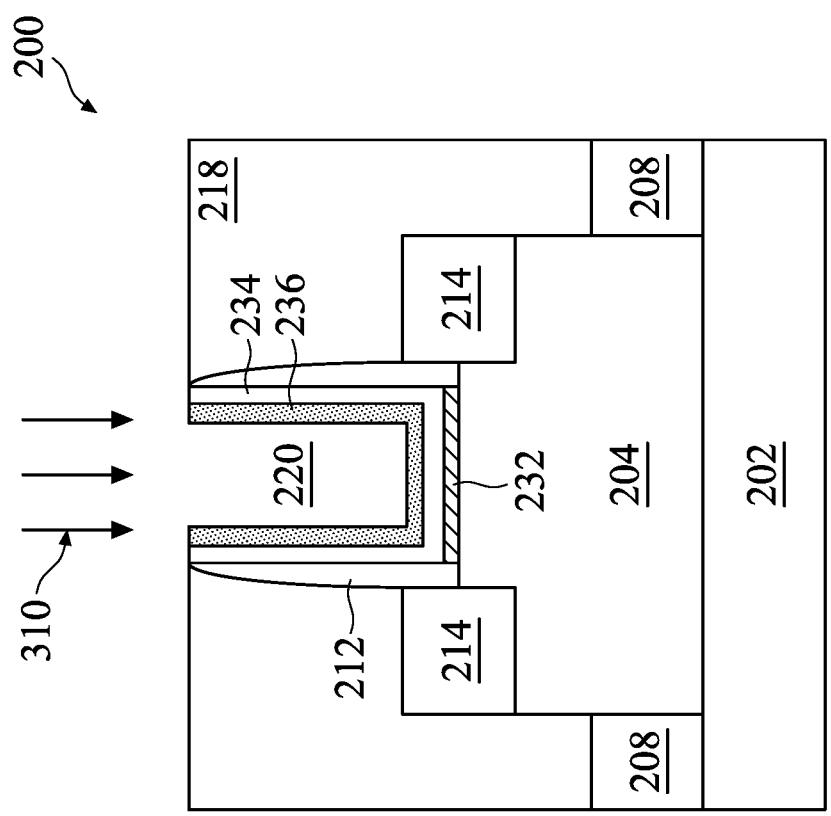
Figure 5B:
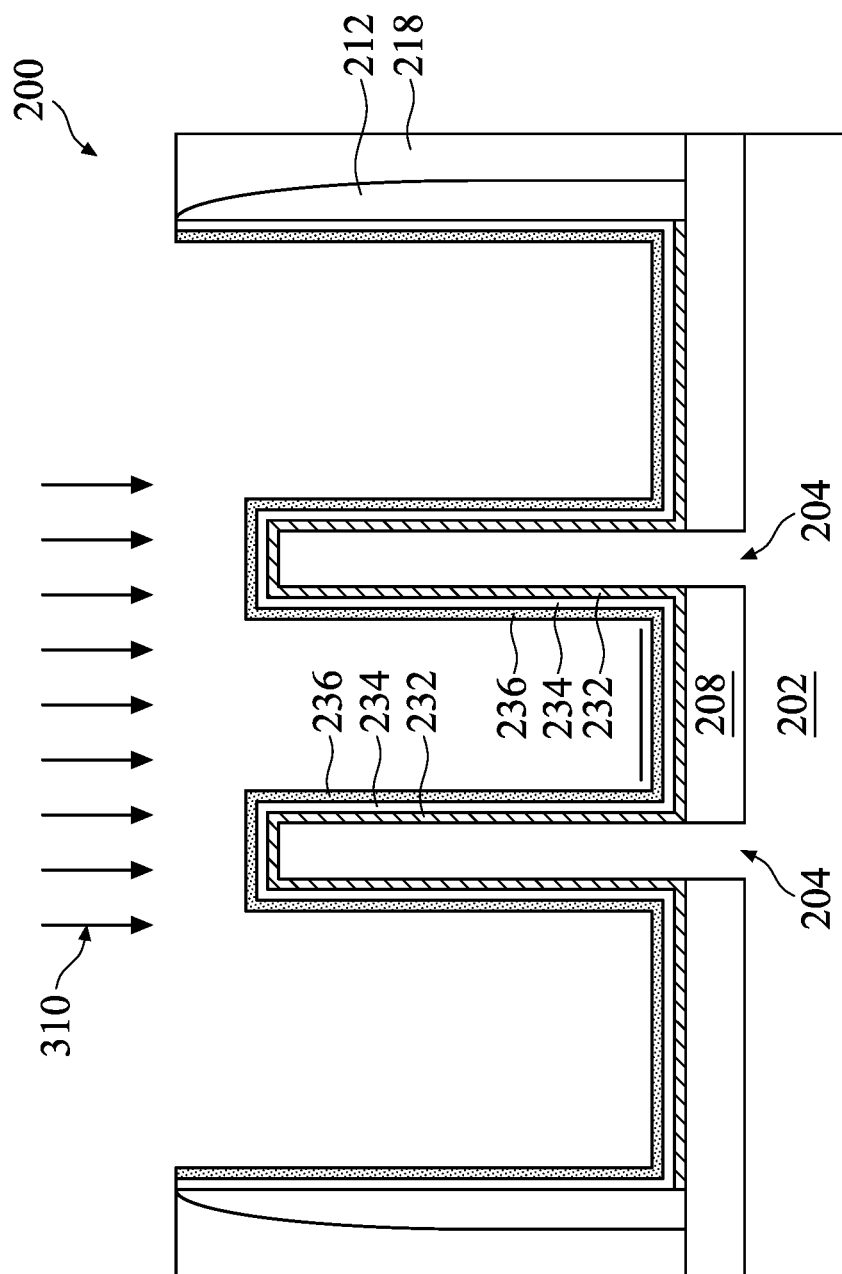

Referring to FIGS. 1 and 5A-5B, the method 100 proceeds to operation 106 to deposit a metal-containing layer 236 over the high-k dielectric layer 234 using a precursor 310. In many embodiments, the precursor 310, which may be a gaseous species that includes a metal halide such as, for example, a metal chloride or a metal fluoride. In some embodiments, the precursor 310 is delivered via an inert carrier gas such as Ar or He. In the present embodiments, "metal chloride" refers to a compound that includes chlorine and a metallic element, while "metal fluoride" refers to a compound that includes fluorine and a metallic element. The metallic element provided herein includes tantalum (Ta), tungsten (W), and/or titanium (Ti). In the present embodiments, the precursor 310 excludes any aluminum-containing compounds. As such, in some examples, the present embodiments provide that the precursor 310 includes tantalum pentachloride ($TaCl_5$), tantalum pentafluoride ($TaF_5$), tungsten pentachloride ($WCl_5$), tungsten hexachloride ($WCl_6$), tungsten hexafluoride ($WF_6$), and/or titanium tetrachloride ($TiCl_4$). In some embodiments, the deposition process implemented at operation 106 is an ALD process, a CVD process, other suitable processes, or combinations thereof. In the present disclosure, the depositions process is an ALD process that is implemented in an ALD processing chamber. In some examples, the precursor 310 may be applied at a temperature of about 300 degrees Celsius to about 500 degrees Celsius, at a flow rate of about 500 sccm (standard cubic centimeters per minute) to about 1500 sccm, and at a pressure of about 3 Torr to about 10 Torr. Of course, the present disclosure is not limited to these deposition parameters.

In the present embodiments, the precursor 310 is delivered in pulses under conditions disclosed herein. Furthermore, the method 100 at operation 106 includes, after implementing the deposition process, purging any excess precursor 310 from the processing chamber such that a metal-containing layer 236 (discussed in detail below) may be formed over the high-k dielectric layer 234. In the present embodiments, the metal halides provided herein are precursors (in vapor phase, for example) configured to react with a substrate surface (in this case, the high-k dielectric layer 234) through a series of exchange reactions, resulting in the metal-containing layer 236. In some embodiments, the metal-containing layer 236 includes Ta, W, and/or Ti in their metallic forms (i.e., no longer halides). Notably, the metal-containing layer 236 provided herein is free of Al.

Figure 6A:
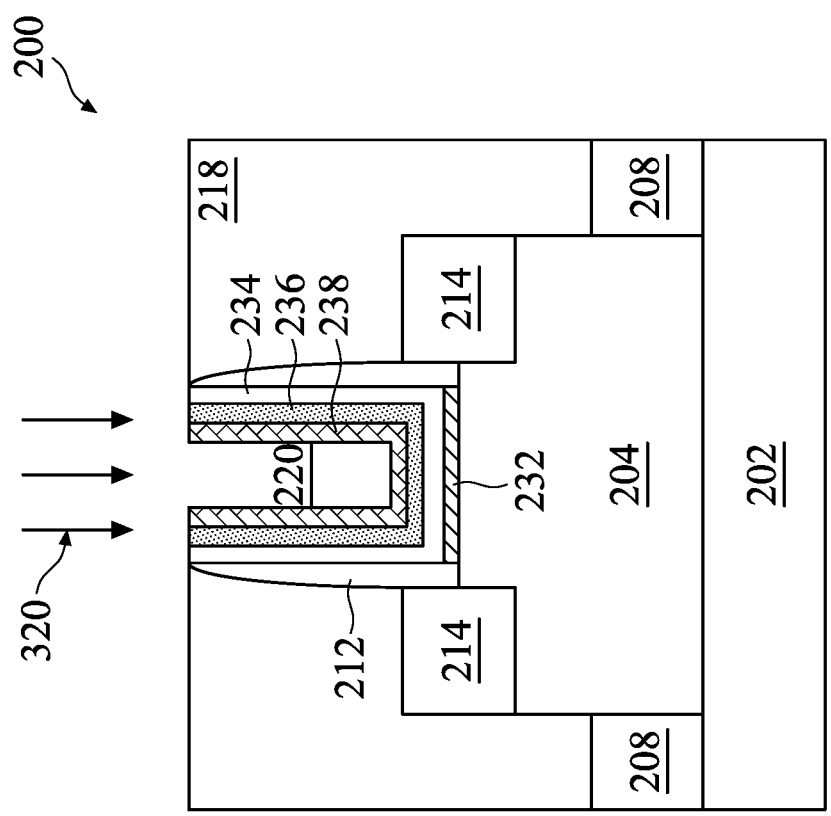
Figure 6B:
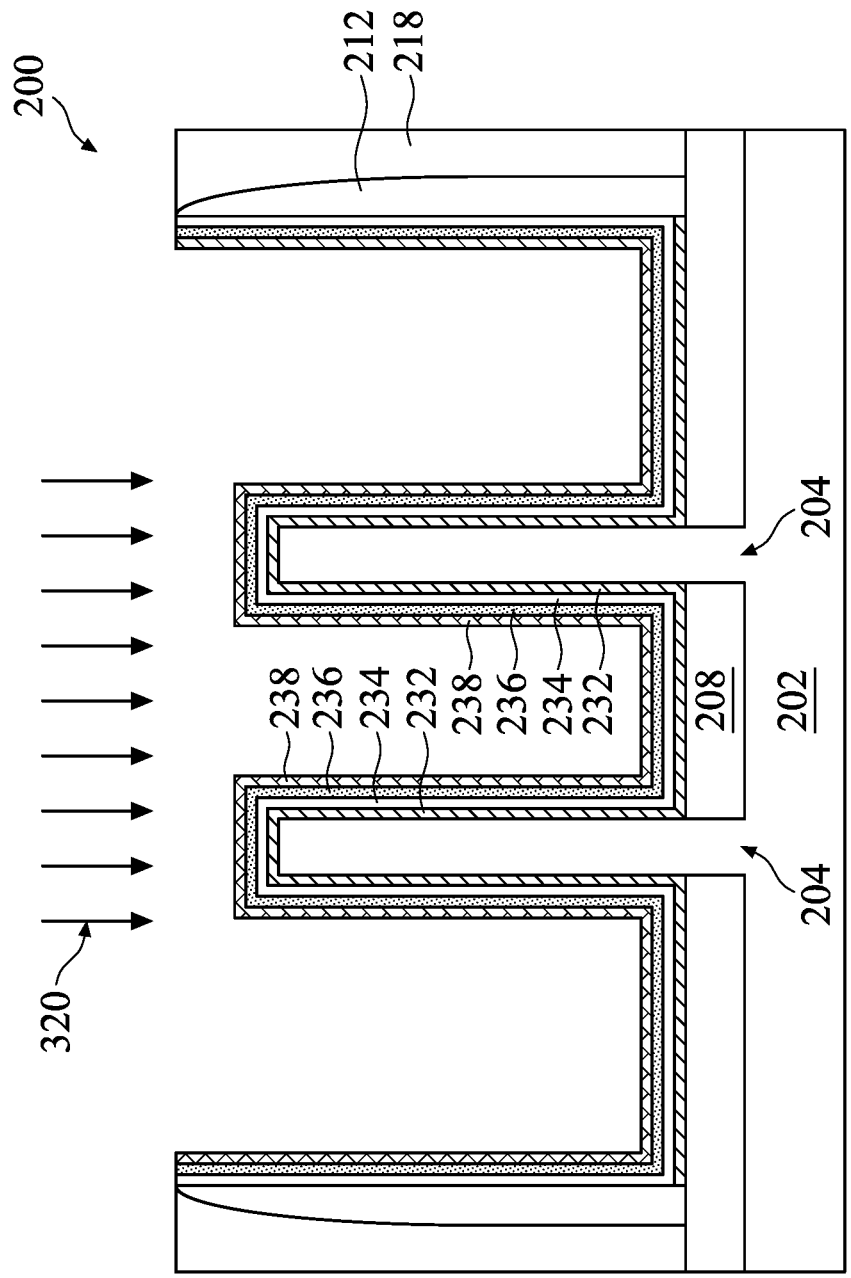

Referring to FIGS. 1 and 6A-6B, the method 100 proceeds to operation 108 to form an Al-containing layer 238 over the high-k dielectric layer 234 using a precursor 320. In some embodiments, the deposition process at operation 108 is an ALD process, a CVD process, other suitable processes, or combinations thereof. In the present disclosure, conditions of the depositions process at operation 108 are similar to those of the deposition process at operation 106 and may be implemented in the same ALD processing chamber as the deposition process at operation 106. For example, the precursor 320 delivered by an inert carrier gas discussed above may be applied at a temperature of about 300 degrees Celsius to about 500 degrees Celsius and at a pressure of about 3 Torr to about 10 Torr. Of course, the present disclosure is not limited to these deposition parameters. Notably, in some embodiments, the method 100 applies the precursor 320 at a lower flow rate than the precursor 310. For example, the method 100 may apply the precursor 320 at a flow rate of about 400 sccm. In some embodiments, the precursor 320 is delivered in pulses under conditions disclosed herein. After applying the precursor 320 over the high-k dielectric layer 234, any excess precursor 320 is removed from the deposition chamber by a purging process similar to that discussed with respect to operation 106, such that an Al-containing layer 238 is formed over the high-k dielectric layer 234.

In the present embodiments, the precursor 320 is an Al-containing precursor including, for example, dimethylaluminum (DMA), trimethylaluminum (TMA), and/or other organo-aluminum compounds. In some examples, a concentration of Al in the precursor 320 may be about 20% to about 40%. In some examples, the as-deposited Al-containing layer 238 may initially be hydroxylated, silanized, and/or methylated depending upon the specific composition of the precursor 320. In some embodiments, the method 100 at operation 108 further includes, after implementing the deposition process and purging any excess precursor 320, performing a chemical treatment to remove any hydroxyl, silane, and/or methyl groups from the Al-containing layer 238.

Figure 8A:
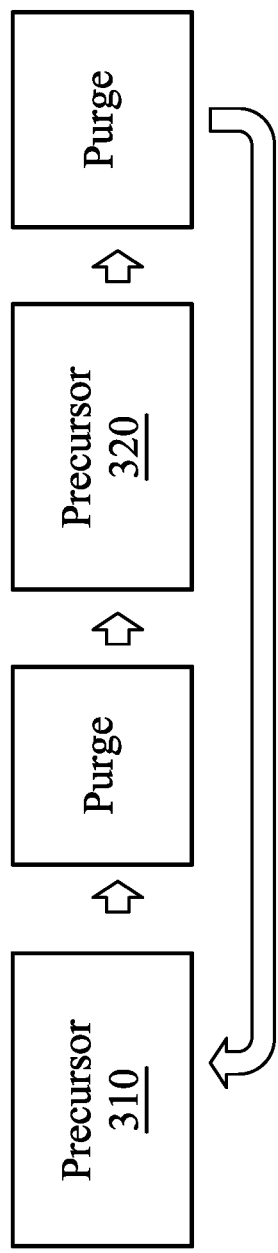
FIG. 8A is a schematic of an embodiment of the method illustrated in FIG. 1 according to some aspects of the present disclosure.

Following deposition of the precursor 320 at operation 108, the method 100 may repeat the application of the precursor 310, followed by another application of the precursor 320, such that the precursors 310 and 320 may be applied in an alternating cyclic manner, as depicted schematically in FIG. 8A. For example, the first cycle of deposition leaves a first metal-containing layer 236 over the high-k dielectric layer 234 and a first Al-containing layer 238 over the first metal-containing layer 236, the second cycle of deposition leaves a second metal-containing layer 236 over the first Al-containing layer 238 and a second Al-containing layer 238 over the second metal-containing layer 236, so on and so forth. In some examples, the method 100 repeats operations 106 and 108 in such alternating cyclic manner for two to eight cycles. Although not limited to a particular cycle number, the extent of such cyclic depositions is controlled in order to ensure proper device performance, details of which are discussed below. Of course, the present disclosure also provides an embodiment in which operations 106 and 108 are each implemented only once. After performing the cyclic deposition process, the metal-containing layer 236 may be formed to a thickness T of about 10 Angstroms to about 50 Angstroms. On one hand, if the thickness T is less than about 10 Angstroms, the metal-containing layer 236 may be considered ineffective in aiding the diffusion of Al atoms. On the other hand, if the thickness T is greater than about 50 Angstroms, the excess amount of metal-containing layer 236 may alter electrical properties of the metal gate structure formed subsequently. In some embodiments, in order to facilitate subsequent diffusion of Al atoms, a thickness T' of the Al-containing layer 238 is greater than the thickness T.

In the present embodiments, referring to FIGS. 7A and 7B, the cyclic applications of the precursors 310 and 320 together facilitate the diffusion of Al atoms through the high-k dielectric layer 234. Specifically, referring to FIG. 7A, after applying the precursor 310, metal halides of the precursor 310 react with surface functionalities (e.g., surface hydroxyl groups—OH) of the high-k dielectric layer 234, thereby disrupting bonding environment within the surface region of the high-k dielectric layer 234. As such molecular rearrangement occurs, it becomes favorable for the subsequently deposited Al atoms in the Al-containing layer 238 to diffuse through the high-k dielectric layer 234 and arrive at an interface between the high-k dielectric layer 234 and the underlying interfacial layer 232. As a result of such diffusion, referring to FIG. 7B, the Al atoms are found in a region 236' over or as a top portion of the high-k dielectric layer 234 and in a region 238' at the interface between the high-k dielectric layer 234 and the interfacial layer 232. In further embodiments, due to the effect of diffusion, concentration of the Al atoms is graded throughout the high-k dielectric layer 234. In other words, the concentration of the Al atoms is greater in the region 236' than in the region 238', and such concentration gradually decreases from the region 236' to the region 238'. Notably, the concentration of the Al atoms within each of the regions 236' and 238' is also graded as a result of the diffusion process.

On the other hand, metal atoms such as Ta, W, and/or Ti (depending upon the specific composition of the precursor 310) remain substantially in the region 236' (i.e., within the metal-containing layer 236) due to a lack of thermodynamic drive and size constrains to diffuse through the high-k dielectric layer 234. In other words, metal atoms such as Ta, W, and/or Ti remain in the region 236' but are absent or substantially absent in the region 238'. In some embodiments, a portion of the region 236' containing the metal atoms is subsequently removed from the device 200 before forming additional layers (e.g., work function metal layer) of the high-k metal gate structure. In the present disclosure, the regions 236' and 238' and the high-k dielectric layer 234 disposed therebetween are collectively referred to as layer 234' hereafter for purposes of simplicity.

In the region 238' specifically, Al atoms form aluminum oxide ($Al_xO_y$, where x and y are suitable integers that satisfy stoichiometric ratios of an aluminum oxide compound, such as 2 and 3, respectively) with the surrounding oxygen atoms of the high-k dielectric layer 234. Notably, the formation of aluminum oxide as disclosed herein relies upon the cyclic depositions of the precursors 310 and 320, which together enable the diffusion of the Al atoms through the high-k dielectric layer 234. Due to difference in oxygen density between aluminum oxide in the region 238' and silicon oxide included in the interfacial layer 232, as well as difference in atomic radius of Al and Si, a differential in the electrical potential between the region 238' and the interfacial layer 232 exists, thereby establishing dipole moments therebetween (see FIG. 7D). In the present embodiments, because aluminum oxide has a higher oxygen density and Al's atomic radius is smaller than that of Si, aluminum oxide presents a relatively positive polarity as oxygen atoms migrate toward silicon oxide, and silicon oxide presents a relatively negative polarity. In many embodiments, formation of aluminum oxide in the region 238' and the dipole moments formed with silicon oxide in the interfacial layer 232 increases effective work function of the subsequently formed metal gate structure (i.e., HKMG) and the threshold voltage $V_t$ thereof (i.e., making the metal gate structure more p-type like). Notably, embodiments provided herein do not rely on patterning of the work function metal layer(s) to tune the $V_t$, which not only reduces processing complexity but also minimizes the dimension of the HKMG to enable fabrication of devices at reduced length scales.

In the present embodiments, it is the co-deposition of the precursor 310 and 320 that facilitates the diffusion of Al atoms through the high-k dielectric layer 234. In other words, without the deposition of the precursor 310, the diffusion of Al atoms through the high-k dielectric layer 234 will not occur unless high-temperature thermal treatments such as rapid thermal anneal (RTA) and the alike are applied to drive the diffusion. Therefore, the present disclosure provides a method of driving the diffusion of the Al atoms to form aluminum oxide in the region 238' without needing to perform any thermal treatment.

Figure 8B:
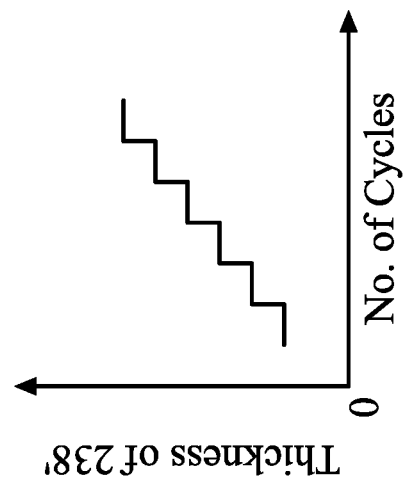
FIG. 8B is a schematic of an embodiment of the present disclosure according to some aspects of the present disclosure.

As discussed above, the formation of aluminum oxide in the region 238' (FIG. 7B) is a result of diffusion of Al atoms provided by the precursor 320. Thus, the amount of aluminum oxide formed in the region 238' depends upon the number of depositions cycles (e.g., alternating cycles of operations 106 and 108 as discussed above with respect to FIGS. 5A-5B and 6A-6B) implemented. This effect is schematically illustrated in FIG. 8B in which the thickness of the region 238' is plotted against the number of cycles, demonstrating a positive correlation between the two parameters. In some examples, a thickness h of the region 238' is about 2 Angstroms to about 5 Angstroms. On one hand, if h is less than about 2 Angstroms, the amount of aluminum oxide in the region 238' may be insufficient for forming dipole moments with the silicon oxide in the interfacial layer 232. On the other hand, too much aluminum oxide (i.e., h being greater than about 5 Angstroms) may potentially compromise overall performance of the device. This may be due to the fact that aluminum oxide generally has a lower dielectric constant than a high-k material such as hafnium oxide, leading to decreases in electron mobility and increases in capacitance equivalent thickness (CET). In some embodiments of the present disclosure, the region 238' is free of any metallic component of the metal-containing layer 236 (e.g., Ta, W, and/or Ti).

Thereafter, referring to FIGS. 1 and 7C, following the cyclic depositions at operations 106 and 108, the method 100 at operation 109 removes a portion of the region 236'. In the present embodiments, the method 100 performs a wet etching process to remove the portion of the region 236' using a solvent that includes, for example, ammonia ($NH_3$), peroxide ($H_2O_2$), sulfuric acid ($H_2SO_4$), hydrofluoric acid (HF), hydrochloric acid (HCl), nitric acid ($HNO_3$), and/or other suitable solvents. In some embodiments, the remaining portion of the region 236' has a thickness t that is less than the thickness T of the metal-containing layer 236 resulted from the cyclic depositions after performing operations 106 and 108.

Figure 9A:
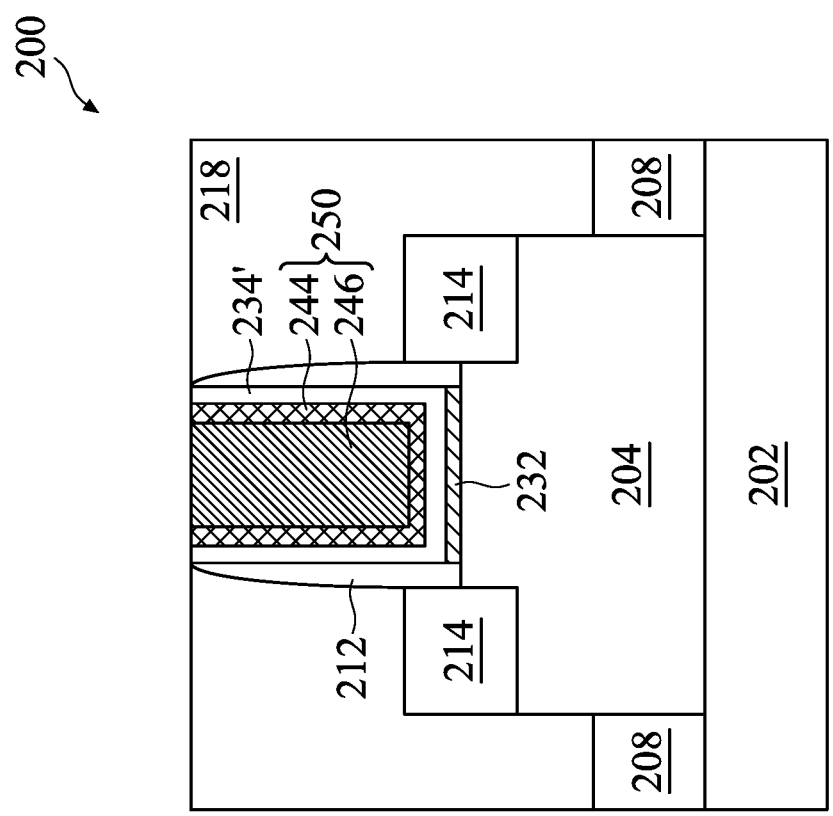
Figure 9B:
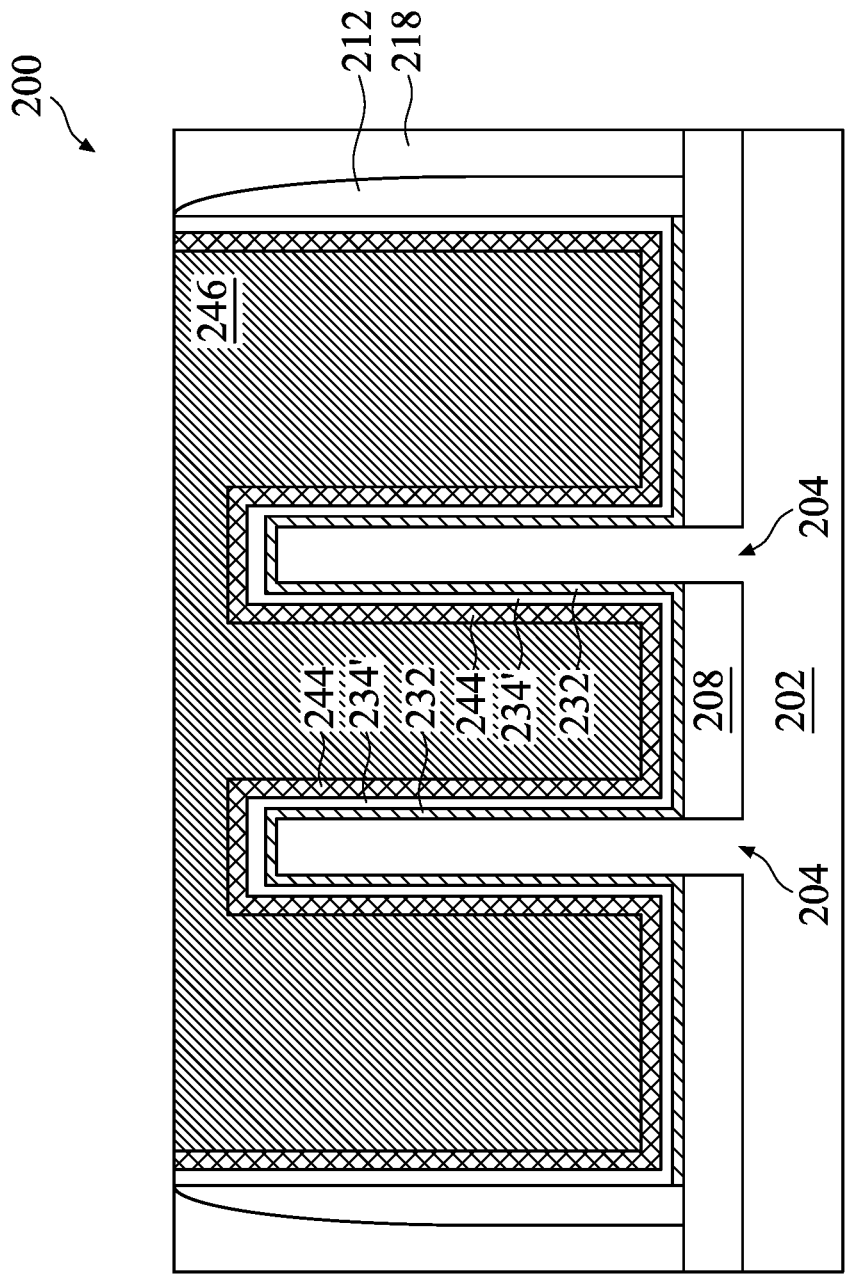

Referring to FIGS. 1 and 9A-9B, the method 100 at operation 110 forms a metal gate structure 250 over the layer 234', which includes the high-k dielectric layer 234 and the regions 236' and 238' as discussed above. In many embodiments, forming the metal gate structure 250 includes forming a work function metal layer 244 over the layer 234'. The work function metal layer 244 may be a p-type or an n-type work function metal layer. Example work function metals include TiN, TaN, Ru, Mo, Al, WN, $ZrSi_2$, $MoSi_2$, $TaSi_2$, NiSi$_2$, WN, Ti, Ag, TaAl, TaAlC, TiAlN, TaC, TaCN, TaSiN, Mn, Zr, other suitable work function materials, or combinations thereof. The work function metal layer 244 may include a plurality of layers and may be deposited by ALD, CVD, PVD, other suitable processes, or combinations thereof.

Thereafter, referring still to FIGS. 9A-9B, the method 100 at operation 110 forms a bulk conductive layer 246 over the work function metal layer 244 to complete the formation of the metal gate structure 250. In the present embodiments, the interfacial layer 232, the layer 234', and the metal gate structure 250 together form an HKMG. The bulk conductive layer 246 may include W, Al, copper (Cu), cobalt (Co), ruthenium (Ru), gold (Au), silver (Ag), and/or other suitable conductive materials. Referring to FIG. 9A, the bulk conductive layer 246 fills the remaining space of the trench 220. The bulk conductive layer 246 may be formed by CVD, PVD, plating, other suitable processes, or combinations thereof. A CMP process may be performed to remove excess materials from the HKMG so as to planarize a top surface of the device 200.

In some embodiments, forming the metal gate structure 250 at operation 110 includes forming various additional material layers. For example, a capping layer (not depicted) may be formed over the high-k dielectric layer 234 to protect the underlying high-k dielectric layer 234 from subsequent thermal processes. The capping layer may include a metal nitride, such as TiN, TaN, NbN, or other suitable materials and may be formed to any suitable thickness by a deposition process such as ALD, CVD, PVD, other suitable processes, or combinations thereof. In some examples, a barrier layer (not depicted) may be formed over the layer 234' (e.g., over the capping layer). In many embodiments, the barrier layer is configured to protect the underlying layer 234' from metal impurities introduced in subsequent fabrication processes, such as forming of the work function metal layer 244. The barrier layer may include a metal nitride, such as TaN, TiN, NbN, other suitable materials, or combinations thereof and may be formed to any suitable thickness by a deposition process such as ALD, CVD, PVD, other suitable processes, or combinations thereof.

Subsequently, at operation 116, the method 100 performs additional processing steps to the device 200. For example, additional vertical interconnect features such as contacts and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

Figure 10:
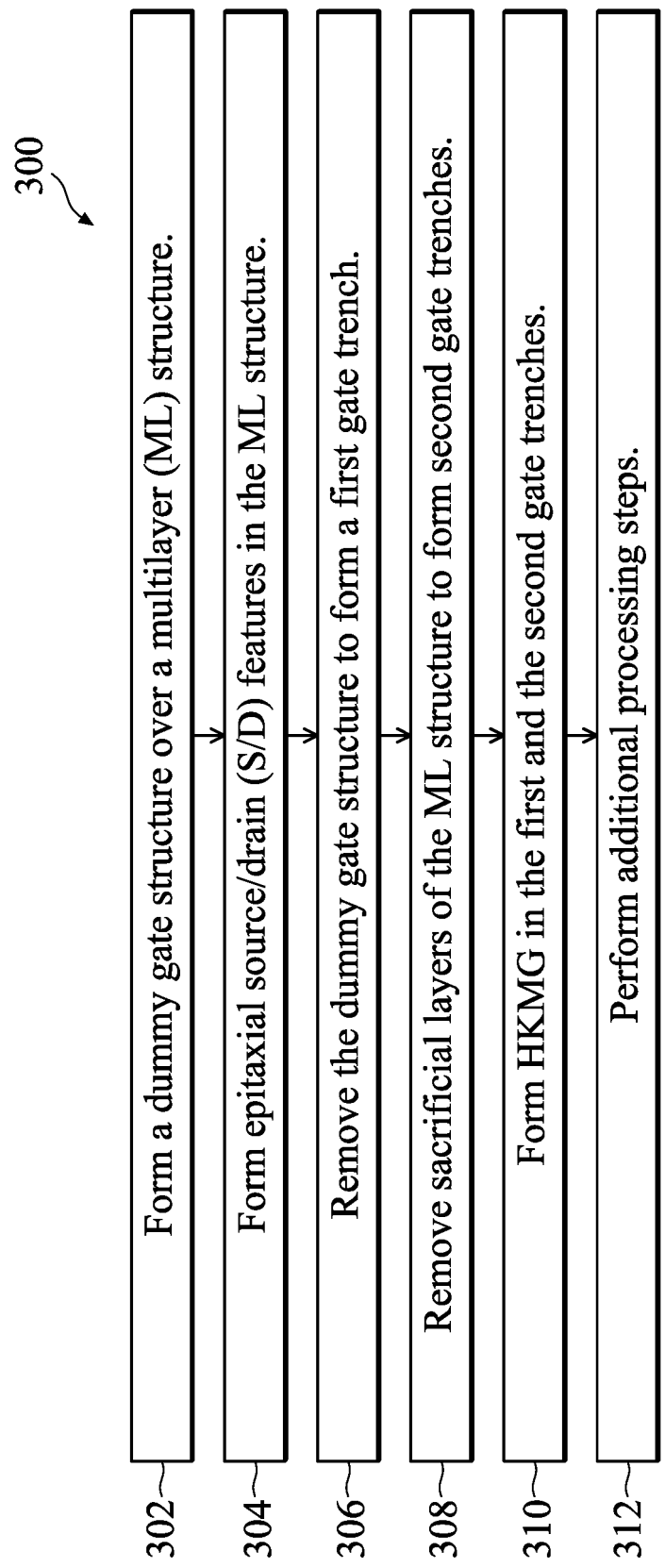
FIG. 10 shows a flow chart of a method of fabricating a semiconductor device according to various aspects of the present disclosure.

While the examples described above relate to a formation of a FinFET, the principles described therein may be applied to other semiconductor structures such as GAA devices. GAA devices generally include active regions in the form of semiconductor nanowire or nanosheet structures. A gate structure (e.g., a HKMG) is then able to be formed "all-around" the active regions, such that the gate structure is in contact on all four sides of the channel region of the device. The following disclosure briefly discusses a method 300 as depicted in FIG. 10 for applying the present embodiments described above to a GAA device 200'. It is noted that components common to the device 200 and the GAA device 200' are referred to by the same notations in FIGS. 11A-11D as those in FIGS. 2-9B.

Figure 11A:
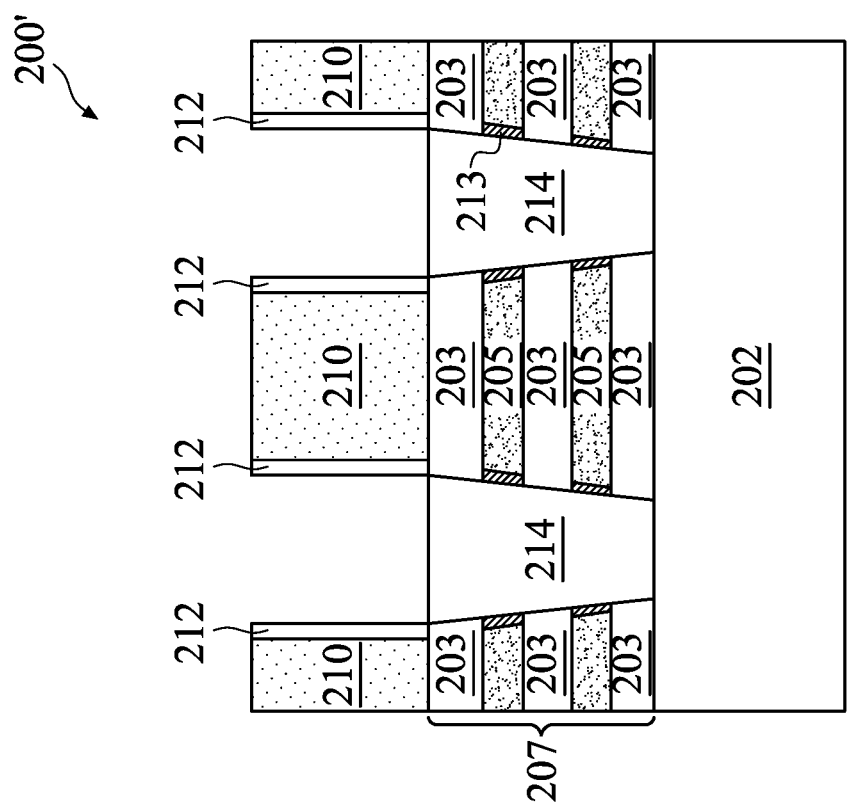
FIGS. 11A, 11B, 11C, and 11D are cross-sectional views of an embodiment of the semiconductor device of FIG. 2 along line AA' during intermediate steps of an embodiment of the method of FIG. 10 according to various aspects of the present disclosure.

Referring to FIG. 11A, the method 300 at operation 302 forms the dummy gate structure 210 (with the gate spacers 212 formed on its sidewalls) over a multi-layer (ML) structure 207. The ML structure 207 includes alternating layers of the active regions (e.g., semiconductor nanosheets) 203 and a plurality of sacrificial layers 205. The sacrificial layers 205 may include any suitable materials, e.g., a semiconductor material different from the semiconductor material included in the active regions 203. For example, the active regions 203 may include silicon and the sacrificial layers 205 may include germanium. The active regions 203, which may be similar to the fin 204 in composition, the dummy gate structure 210, and methods of forming the same have been discussed in detail above with respect to operation 102 and FIG. 2.

Still referring to FIG. 11A, the method 300 at operation 304 forms source/drain features 214 in the ML structure 207. In some embodiments, the method 300 forms the source/drain features 214 in a process substantially similar to operation 102 as discussed above with respect to FIG. 2. For example, the method 300 may first form source/drain recesses in the ML structure 207 adjacent the dummy gate structure 210. Subsequently, the method 300 may implement an optional cleaning process to the source/drain recesses before forming an epitaxial material in the source/drain recesses. In some embodiments, depending upon the composition of the active regions 203 and the sacrificial layers 205, suitable etchant(s) is chosen for etching portions of the ML structure 207. In some embodiments, inner spacers 213 are formed on portions of the sacrificial layers 205 exposed in the source/drain recesses before forming the source/drain features 214. Alternatively, the inner spacers 213 may be formed at a subsequent processing step, e.g., after removing the sacrificial layers 205, as discussed below.

Figure 11B:
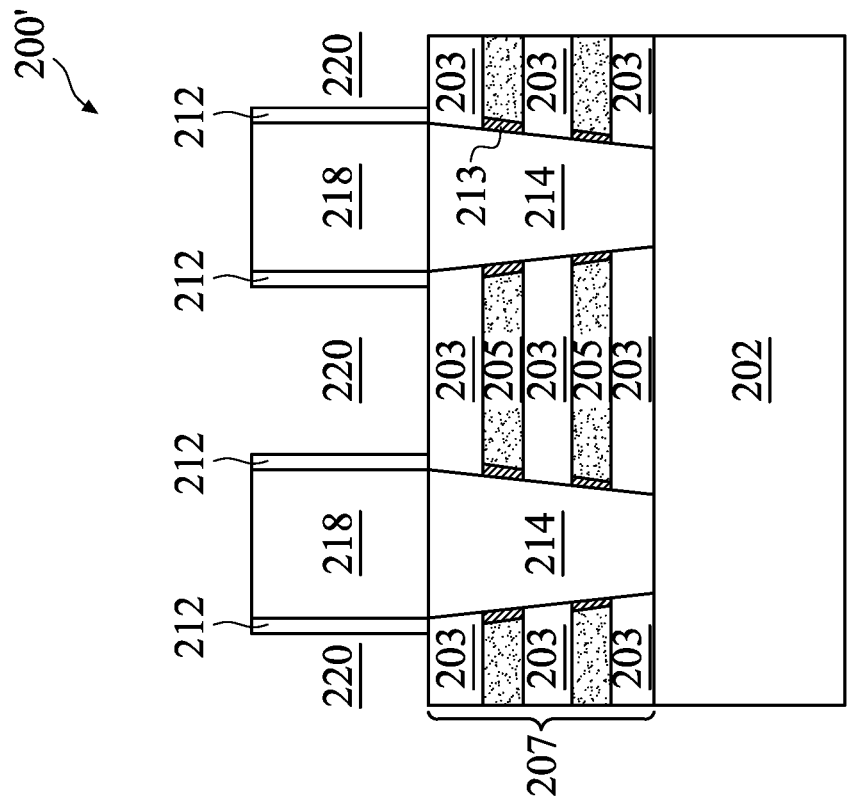

Subsequently, referring to FIG. 11B, the method 300 at operation 306 removes the dummy gate structure 210 to form the trenches 220. In some embodiments, the method 300 removes the dummy gate structure 210 in a process substantially similar to operation 102 as discussed above with respect to FIG. 2. For example, the method 300 first forms the ILD layer 218 over the ML structure 207 and selectively removes the dummy gate structure 210 to form the trenches 220. In some embodiments, though not depicted, removing the dummy gate structure 210 exposes the interfacial layer 232 formed over the ML structure 207. Alternatively, as depicted herein and discussed below, the interfacial layer 232 may be formed in the trench 220 before forming the HKMG.

Figure 11C:
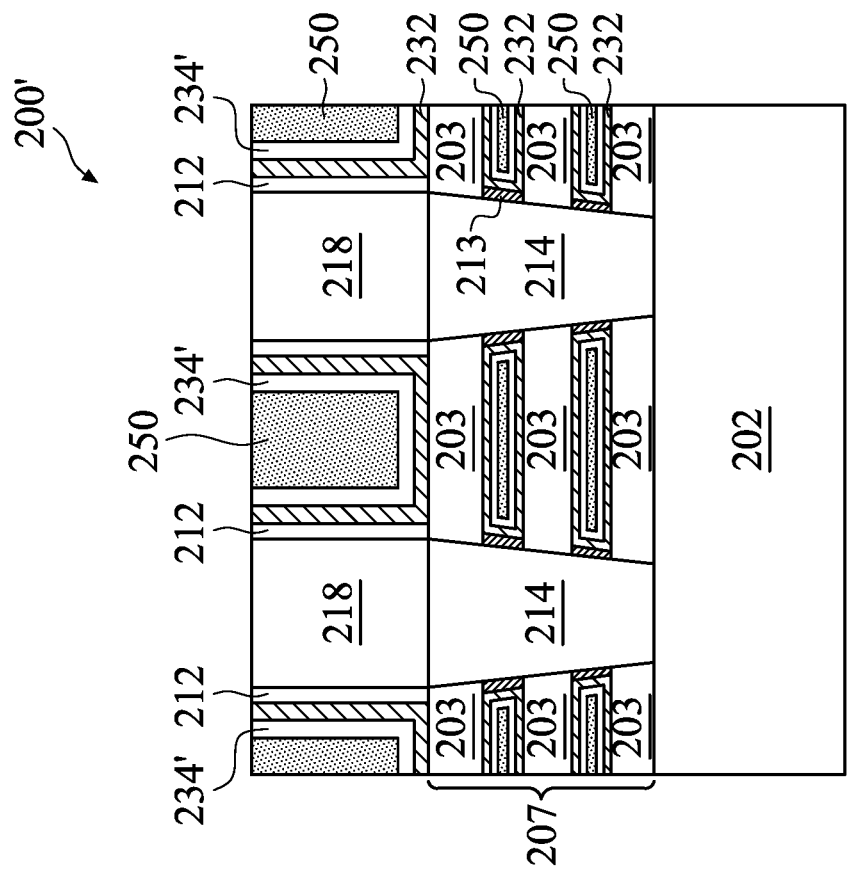

Thereafter, referring to FIG. 11C, the method 300 at operation 308 removes the sacrificial layers 205 from the ML structure 207, resulting in trenches 230. The method 300 may remove the sacrificial layers 205 using any suitable etching process, such as a dry etching process. The method 300 is configured to selectively remove the sacrificial layers 205 without removing or substantially removing the active regions 203. In some embodiments, the method 300 forms the inner spacers 213 on portions of the source/drain features 214 exposed in the trenches 230.

Figure 11D:
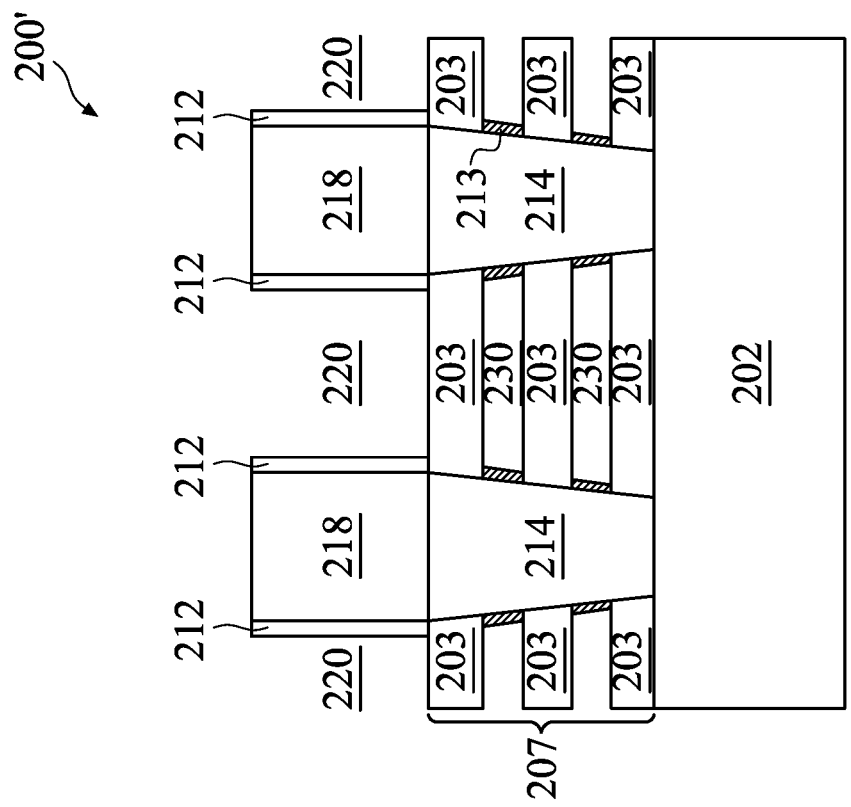

Referring to FIG. 11D, the method 300 forms the HKMG in the trenches 220 and 230. In some embodiments, method 300 forms the HKMG, which includes at least the interfacial layer 232, the layer 234', and the metal gate structure 250, in a process substantially similar to operations 104-112 as discussed above. For example, the method 300 may include forming the high-k dielectric layer 234 over the interfacial layer 232, performing cyclic deposition of the metal-containing precursor 310 and the Al-containing precursor 320 to form the regions 236' and 238' in the high-k dielectric layer 234, thereby resulting in the layer 234', removing a portion of the region 236', and subsequently forming a metal gate structure 250 over the layer 234'. Thereafter, the method 300 may perform additional processing steps to the device 200', such as forming source/drain contacts over the source/drain features 214, forming gate contacts over the HKMG, forming additional horizontal and vertical interconnect structures, etc.

Although not intended to be limiting, one or more embodiments of the present disclosure provide many benefits to a semiconductor device and the formation thereof. For example, embodiments of the present disclosure provide methods of tuning the threshold voltage $V_t$ of a HKMG by introducing dipole moments within the gate dielectric layer of the HKMG. Generally, threshold voltage $V_t$ of a HKMG may be modulated by adjusting a thickness of each work function metal layer (e.g., the work function metal layer 244 and/or other additionally formed work function metal layers) included therein. However, as feature sizes decrease, controlling thicknesses of multiple work function metal layers during lithography and patterning processes poses many challenges. In at least one embodiment, the threshold voltage $V_t$ may be modulated by forming a metal oxide layer (e.g., aluminum oxide layer) at an interface between the gate dielectric layer and the interfacial layer, where the metal oxide layer has a composition (e.g., oxygen density) different from that of the interfacial layer. In some embodiments, the metal oxide species in the metal oxide layer forms dipole moments with the species (e.g., silicon oxide) of the interfacial layer, creating differentials in electrical potential of the overall HKMG. In the present disclosure, such differentials increase the work function, and therefore the $V_t$, of the HKMG, without needing to adjust the type(s) and/or number of work function metal layers of the HKMG and without requiring high-energy thermal treatment such as RTA.

In one aspect, the present disclosure provides a method that includes forming a gate dielectric layer over an interfacial layer disposed over a semiconductor structure, applying a first metal-containing precursor over the gate dielectric layer to form a first metal-containing layer, applying a second metal-containing precursor over the first metal-containing layer to form a second metal-containing layer at an interface between the gate dielectric layer and the interfacial layer, and subsequently forming a metal gate stack over the gate dielectric layer.

In another aspect, the present disclosure provides a method that includes removing a dummy gate structure to form a gate trench over a semiconductor layer, forming a high-k gate dielectric layer over an interfacial layer exposed in the gate trench, depositing a metal-containing precursor over the high-k gate dielectric layer to form a metal-containing layer, and subsequently depositing an aluminum-containing precursor over the metal-containing layer, where depositing the aluminum-containing precursor forms an aluminum oxide layer at an interface between the high-k gate dielectric layer and the interfacial layer and where the metal-containing precursor includes a metal different from aluminum. The method further includes, subsequent to depositing the aluminum-containing precursor, removing a portion of the metal-containing layer, depositing a work-function metal layer over a remaining portion of the metal-containing layer, and forming a bulk conductive layer over the work-function metal layer, resulting in a metal gate structure.

In yet another aspect, the present disclosure provides a semiconductor structure that includes an interfacial layer disposed over a semiconductor layer, a high-k gate dielectric layer disposed over the interfacial layer, where the high-k gate dielectric layer includes a first metal, a metal oxide layer disposed at an interface between the high-k gate dielectric layer and the interfacial layer, where the metal oxide layer is configured to form a dipole moment with the interfacial layer, and a metal gate stack disposed over the high-k gate dielectric layer. In many embodiments, the metal oxide layer includes a second metal different from the first metal, and a concentration of the second metal decreases from a top surface of the high-k gate dielectric layer to the interface between the high-k gate dielectric layer and the interfacial layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an interfacial layer disposed over a semiconductor fin;
   a high-k gate dielectric layer disposed over the interfacial layer, wherein the high-k gate dielectric layer includes a first metal;
   a metal oxide layer disposed between the high-k gate dielectric layer and the interfacial layer, wherein the metal oxide layer is configured to form a dipole moment with the interfacial layer, wherein the metal oxide layer includes a second metal different from the first metal, and wherein concentration of the second metal gradually decreases within the metal oxide layer; and
   a metal gate electrode disposed over the high-k gate dielectric layer.

2. The semiconductor structure of claim 1, wherein the second metal is aluminum.

3. The semiconductor structure of claim 1, further comprising a metal halide layer disposed between the high-k gate dielectric layer and the metal gate electrode, wherein the metal halide layer includes a third metal different from the first metal and the second metal.

4. The semiconductor structure of claim 3, wherein the metal halide layer includes tantalum pentachloride ($TaCl_5$), tantalum pentafluoride ($TaF_5$), tungsten pentachloride ($WCl_5$), tungsten hexachloride ($WCl_6$), tungsten hexafluoride ($WF_6$), titanium tetrachloride ($TiCl_4$), or combinations thereof.

5. The semiconductor structure of claim 1, wherein the high-k gate dielectric layer includes the second metal, and wherein the concentration of the second metal is graded within the high-k gate dielectric layer.

6. The semiconductor structure of claim 1, wherein the metal oxide layer increases threshold voltage of the metal gate electrode.

7. The semiconductor structure of claim 1, wherein the interfacial layer includes silicon oxide, the high-k gate dielectric layer includes hafnium oxide, and the metal oxide layer includes aluminum oxide.

8. A semiconductor structure, comprising:
- a semiconductor fin disposed over a substrate;
- an interfacial layer disposed over a channel region of the semiconductor fin;
- an oxide layer disposed over the interfacial layer, the oxide layer including a first metal oxide, wherein concentration of a metal in the first metal oxide is graded within the oxide layer;
  - a gate dielectric layer disposed over the oxide layer, the gate dielectric layer including a second metal oxide that is different from the first metal oxide;
  - a metal halide layer disposed over the gate dielectric layer; and
  - a metal gate electrode disposed over the metal halide layer.

9. The semiconductor structure of claim 8, wherein the interfacial layer includes silicon oxide and the gate dielectric layer includes hafnium oxide.

10. The semiconductor structure of claim 8, wherein the first metal oxide includes aluminum oxide.

11. The semiconductor structure of claim 10, wherein the metal halide layer and the gate dielectric layer each include aluminum, and wherein concentration of aluminum gradually decreases from the metal halide layer toward the gate dielectric layer.

12. The semiconductor structure of claim 10, wherein the metal halide layer includes tantalum pentachloride ($TaCl_5$), tantalum pentafluoride ($TaF_5$), tungsten pentachloride ($WCl_5$), tungsten hexachloride ($WCl_6$), tungsten hexafluoride ($WF_6$), titanium tetrachloride ($TiCl_4$), or combinations thereof.

13. The semiconductor structure of claim 8, wherein the semiconductor fin includes a plurality of semiconductor layers, and wherein the metal gate electrode is interleaved with the plurality of semiconductor layers.

14. The semiconductor structure of claim 8, wherein the oxide layer and the interfacial layer form a dipole moment.

15. A semiconductor structure, comprising:
- a semiconductor fin protruding from a substrate;
- an interfacial layer disposed over the semiconductor fin, the interfacial layer including a first oxide;
- a high-k gate dielectric layer disposed over the interfacial layer, wherein the high-k gate dielectric layer includes a second oxide, and wherein the second oxide includes a first metal;
- a first metal-containing layer disposed between and directly contacting the interfacial layer and the high-k gate dielectric layer, wherein the first metal-containing layer includes a second metal that differs from the first metal, and wherein concentration of the second metal gradually decreases from bottom surface of the high-k gate dielectric layer toward a top surface of the interfacial layer;
- a second metal-containing layer disposed over the high-k gate dielectric layer; and
- a metal gate electrode disposed over the second metal-containing layer.

16. The semiconductor structure of claim 15, wherein the first metal includes hafnium and the second metal includes aluminum.

17. The semiconductor structure of claim 15, wherein the second metal-containing layer includes a third metal that differs from the first metal and the second metal, and wherein the third metal includes tantalum, tungsten, titanium, or combinations thereof.

18. The semiconductor structure of claim 17, wherein the third metal is included in the second metal-containing layer in a form of a metal halide.

19. The semiconductor structure of claim 15, wherein the high-k gate dielectric layer includes the second metal, and wherein the concentration of the second metal gradually decreases from a top surface of the high-k gate dielectric layer toward a bottom surface of the high-k gate dielectric layer.

20. The semiconductor structure of claim 15, wherein the second metal-containing layer includes the second metal, and wherein the concentration of the second metal decreases from a top surface of the second metal-containing layer toward a bottom surface of the second metal-containing layer.

* * * * *